United States Patent [19]

Furman

[11] 4,241,267
[45] Dec. 23, 1980

[54] SWITCHING DEVICE

[76] Inventor: Anatoly V. Furman, ulitsa Chkalova, 21, kv. 6, Moskovskaya oblast, Zhukovsky, U.S.S.R.

[21] Appl. No.: 914,215

[22] Filed: Jun. 9, 1978

[51] Int. Cl.³ .................... H03K 17/00; H03K 17/08
[52] U.S. Cl. .................................... 307/239; 307/229
[58] Field of Search ................. 328/76; 307/230, 239, 307/242, 247 A, 229

[56] References Cited
PUBLICATIONS

S. Marjanovic et al., "A High Speed, High Accuracy Digitally-Set Potentiometer," Radio and Electronic Engineer, vol. 38, No. 6, Dec. 1969, pp. 345-351.

*Primary Examiner*—John Zazworsky
*Attorney, Agent, or Firm*—Fleit & Jacobson

[57] ABSTRACT

Disclosure is made of a switching device on the basis of an active switching element. The device is built around an operational amplifier whose negative feedback circuit incluses serially connected key elements. Control inputs of the key elements are connected to a control bus. Interposed between an inverting input and an output of the operational amplifier is a key element whose control input is connected to the control bus via a single-shot multivibrator and a delay line placed in series therewith.

1 Claim, 1 Drawing Figure

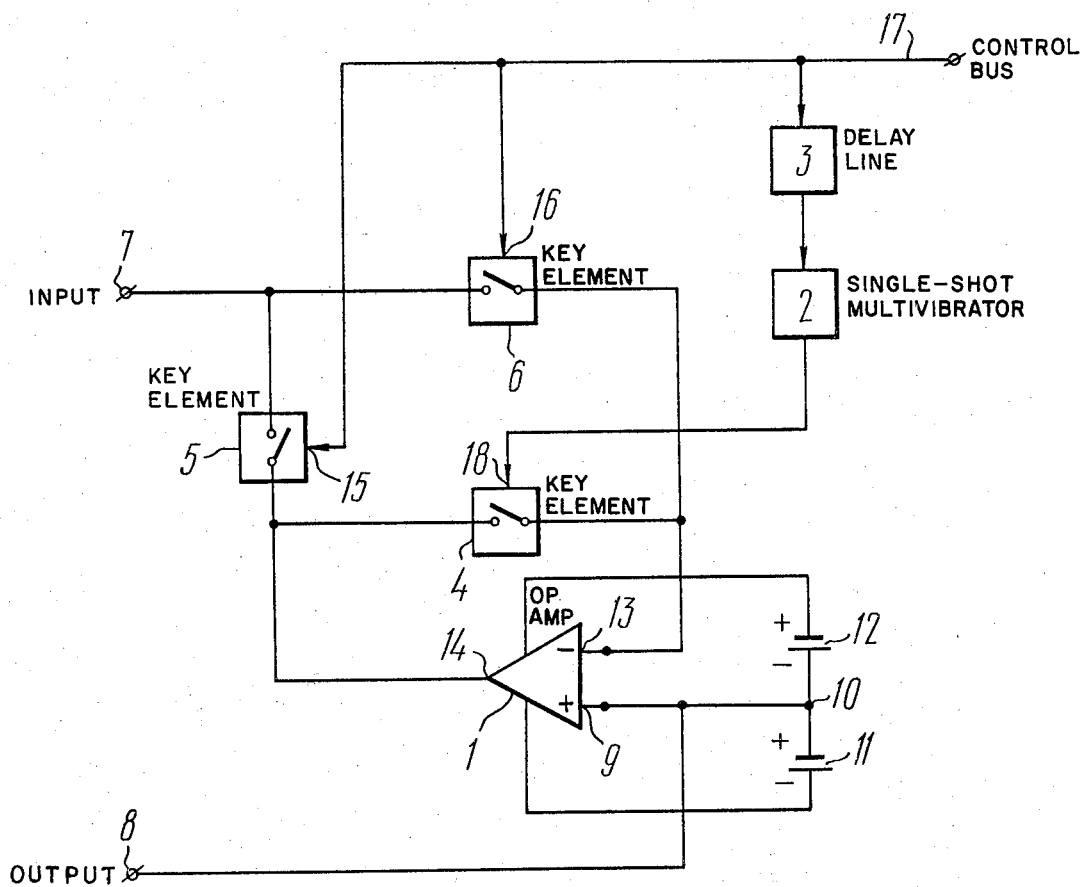

SWITCHING DEVICE

FIELD OF THE INVENTION

The present invention relates to electric signal commutation equipment and, more particularly, to a switching device.

The device of this invention is applicable, for example, to switching standard resistors of multidigit conductance or resistance boxes.

BACKGROUND OF THE INVENTION

There is known a switching device which is an active switching element built around an operational amplifier having two key elements placed in series in its negative feedback circuit. When the key elements are energized, the negative feedback circuit of the operational amplifier is closed, and the transition resistance between the input and output terminals of the device is reduced to a small value (cf. S. Marjanovic, D. R. Noaks, "A High Speed, High Accuracy Digitally-Set Potentiometer," *Radio and Electron, Eng.*, 1969, vol. 38, No. 6, pp. 345–351).

The device under review has a low reliability because, when the key elements make or break the circuit, the operational amplifier is not protected from overvoltages in its input circuit. Apart from being the cause of the low reliability of the switching device under review, this disadvantage accounts for a limited sphere of application of switching devices incorporating active switching elements.

It is an object of the present invention to improve the reliability of the switching device.

SUMMARY OF THE INVENTION

The foregoing object is attained by providing a switching device comprising an active switching element built around an operational amplifier with two key elements placed in series in its negative feedback circuit and having their control inputs connected to a control bus, which device further includes, according to the invention, a single-shot multivibrator and a delay line, whereas interposed between an inverting input and an output of the operational amplifier is a key element whose control input is connected to the control bus via the single-shot multivibrator and the delay line which is placed in series therewith.

The proposed design accounts for an improved reliability of the switching device.

BRIEF DESCRIPTION OF THE ACCOMPANYING DRAWING

Other objects and advantages of the present invention will become more apparent from the following detailed description of a preferred embodiment thereof to be read in conjunction with the accompanying drawing which is a block diagram of a switching device in accordance with the invention.

DETAILED DESCRIPTION OF THE INVENTION

The proposed switching device comprises a switching element built around an operational amplifier 1. The device further includes a single-shot multivibrator 2 and a delay line 3. The operational amplifier 1 has two negative feedback circuits. The first circuit is formed with the aid of a key element 4, whereas the second negative feedback circuit is formed with the aid of key elements 5 and 6. An input terminal 7 of the switching device is the point of connection of the key elements 5 and 6. An output terminal 8 of the switching device is the point of connection of a noninverting input 9 of the operational amplifier 1 and a central tap 10 of power sources 11 and 12. An inverting input 13 of the operational amplifier 1 is connected via the key element 4 to an output 14 of the operational amplifier 1, and via the key element 6 to the input terminal 7. The output 14 of the operational amplifier 1 is connected via the key element 5 to the input terminal 7. Control inputs 15 and 16 of the key elements 5 and 6 are combined and connected to a control bus 17. A control input 18 of the key element 4 is connected via the single-shot multivibrator 2 and the delay line 3 to the control bus 17.

The proposed switching device operates as follows. In the initial state, the key element 4 is closed, and the potential at the inverting input 13 of the operational amplifier 1 is equal to the potential at the output terminal 8 of the switching device. By a signal arriving from a control unit (not shown), the key elements 5 and 6 are closed. The key element 4 is controlled by a signal formed by the single-shot multivibrator 2 and delayed by the delay line 3; this signal arrives from the control bus 17. In the course of the transient process due to the closure of the key elements 5 and 6, the key element 4 remains closed. The key element 4 opens after a delay time which is determined by the delay line 3 and is either equal to or somewhat longer than the duration of the transient process. The potential at the inverting input 13 of the operational amplifier 1 is maintained at a level equal to that of the potential at the output terminal 8; this is due to the negative feedback circuit formed by the closed key elements 5 and 6. The key elements 5 and 6 are opened in a similar manner, although the key element 4 is closed somewhat earlier than the onset of the transient process caused by the opening of the key elements 5 and 6; this period is determined by the duration of the signal formed by the single-shot multivibrator 2. Thus in any operating conditions, the input circuits of the operational amplifier 1 have a potential which is equal to the potential at the output terminal 8, whereby the input circuits of the operational amplifier 1 are protected from input signal overloads. The fact that the key element is closed when the key elements 5 and 6 are opened makes it possible to utilize a correction circuit (not shown) with the operational amplifier 1, which accounts for a high operating speed of the proposed switching device.

What is claimed is:

1. A switching device on the basis of an active switching element, comprising:
   (a) an operational amplifier having an inverting input, a non-inverting input, and an output;
   (b) a first key element and a second key element connected in series between the output and the inverting input of said operational amplifier so as to comprise a first negative feedback circuit of said operational amplifier, said first and second key elements having control inputs;
   (c) a third key element connected between said output and said inverting input of said operational amplifier so as to comprise a second negative feedback circuit, said third key element having a control input;
   (d) a single-shot multivibrator;

(e) a delay line connected in series with said single-shot multivibrator;

(f) a control bus, said control inputs of said first key element and said key element being connected to said control bus, said control input of said third key element being connected to said control bus via said single-shot multivibrator and said delay line which are connected in series therebetween.

* * * * *